United States Patent
Abe et al.

(10) Patent No.: US 8,525,042 B2
(45) Date of Patent: Sep. 3, 2013

(54) PRINTED CIRCUIT BOARD AND PRINTED CIRCUIT BOARD UNIT

(75) Inventors: Mitsunori Abe, Kawasaki (JP); Takashi Fukuda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 75 days.

(21) Appl. No.: 12/690,147

(22) Filed: Jan. 20, 2010

(65) Prior Publication Data

US 2010/0181102 A1 Jul. 22, 2010

(30) Foreign Application Priority Data

Jan. 21, 2009 (JP) ................. 2009-011233

(51) Int. Cl.
*H05K 1/16* (2006.01)
*H05K 7/00* (2006.01)

(52) U.S. Cl.
USPC ........... 174/260; 361/760; 361/767; 361/807; 361/808; 361/810; 174/257; 257/778

(58) Field of Classification Search
USPC ............... 174/257, 259–262; 361/760, 767, 361/807, 808, 810; 257/778
See application file for complete search history.

(56) References Cited

U.S. PATENT DOCUMENTS

| | | | | |
|---|---|---|---|---|
| 5,726,501 | A * | 3/1998 | Matsubara | 257/778 |
| 6,046,410 | A * | 4/2000 | Wojnarowski et al. | 174/262 |
| 6,696,757 | B2 * | 2/2004 | Yunus et al. | 257/735 |
| 6,958,527 | B2 * | 10/2005 | Hanaoka | 257/668 |
| 2007/0272437 | A1 * | 11/2007 | Kondo | 174/260 |

FOREIGN PATENT DOCUMENTS

| | | |
|---|---|---|
| JP | 4-26570 U | 3/1992 |
| JP | 4-243187 A | 8/1992 |
| JP | 5-327293 A | 12/1993 |
| JP | 6-252152 A | 9/1994 |
| JP | 10-294554 A | 11/1998 |
| JP | 2001-36222 A | 2/2001 |
| JP | 2003-8184 A | 1/2003 |
| JP | 2004-186250 A | 7/2004 |
| JP | 2004-228353 A | 8/2004 |
| JP | 2006-229177 A | 8/2006 |
| JP | 2010-123860 A | 6/2010 |
| JP | 2010-161205 A | 7/2010 |

OTHER PUBLICATIONS

Korean Office Action dated Apr. 15, 2011 for corresponding Korean Application No. 10-2010-0004807, with English-language Translation.
Japanese Office Action dated Oct. 16, 2012, for corresponding Japanese Application No. 2009-011233, with Partial English-language Translation.
Japanese Office Action mailed Jun. 11, 2013 for corresponding Japanese Application No. 2009-011233, with Partial English-language Translation.

* cited by examiner

*Primary Examiner* — Jayprakash N Gandhi
*Assistant Examiner* — Dion Ferguson
(74) *Attorney, Agent, or Firm* — Fujitsu Patent Center

(57) ABSTRACT

A printed circuit board on which a surface mount electronic device is mounted. The printed circuit board includes a substrate on which land arrangements are disposed in an array. Each land arrangement includes a core portion and drawing portions. The drawings are disposed along diagonal directions relative to the core portions of the array of the land arrangements.

15 Claims, 13 Drawing Sheets

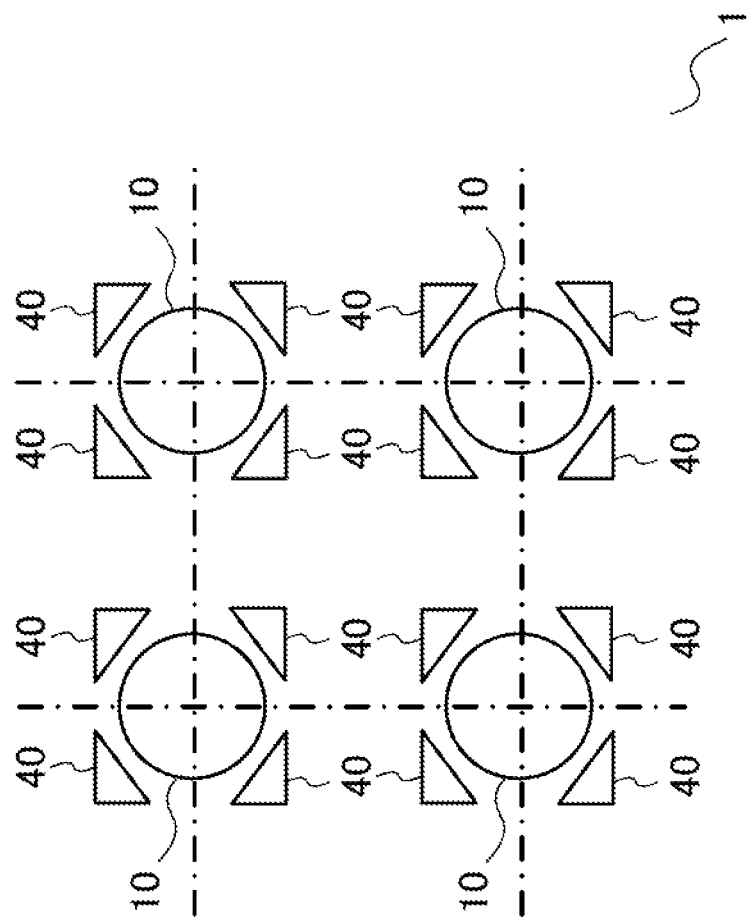

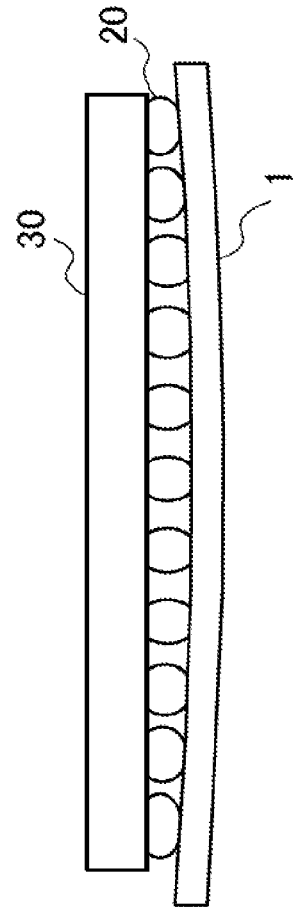
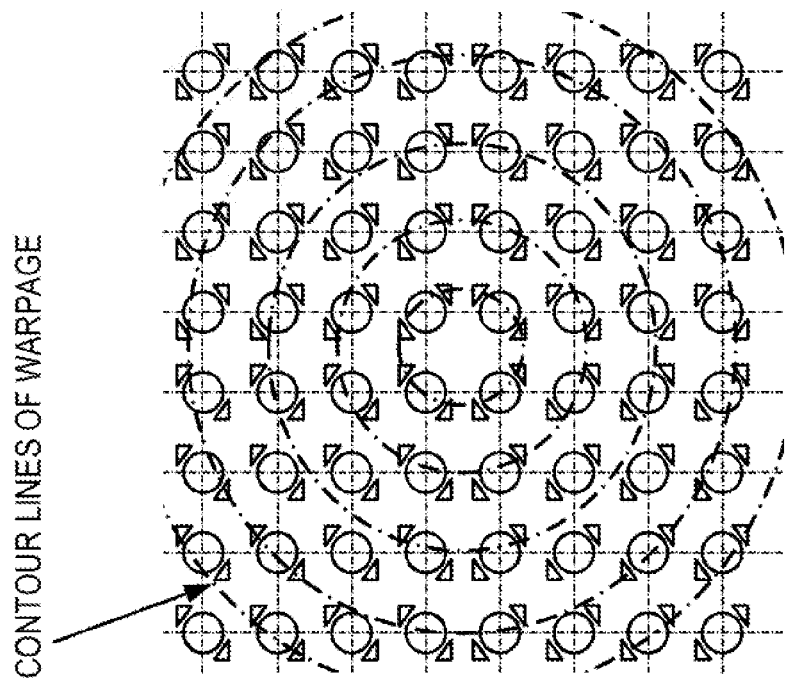

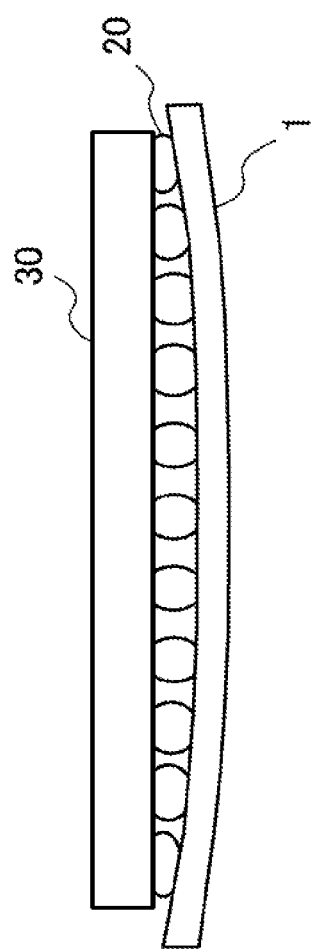
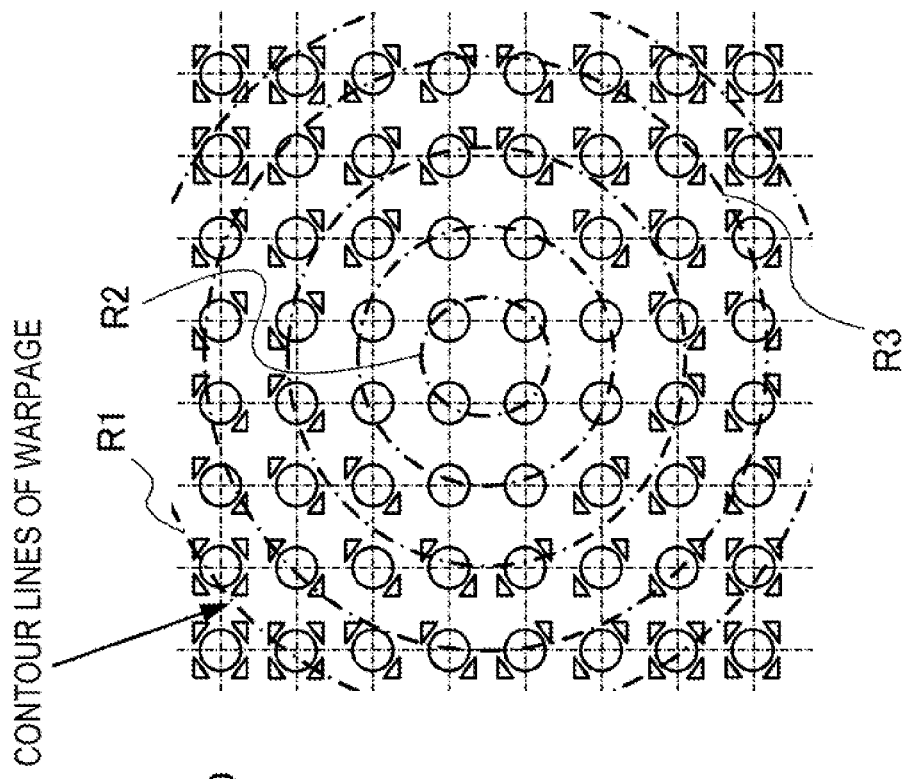

CONTOUR LINES OF WARPAGE

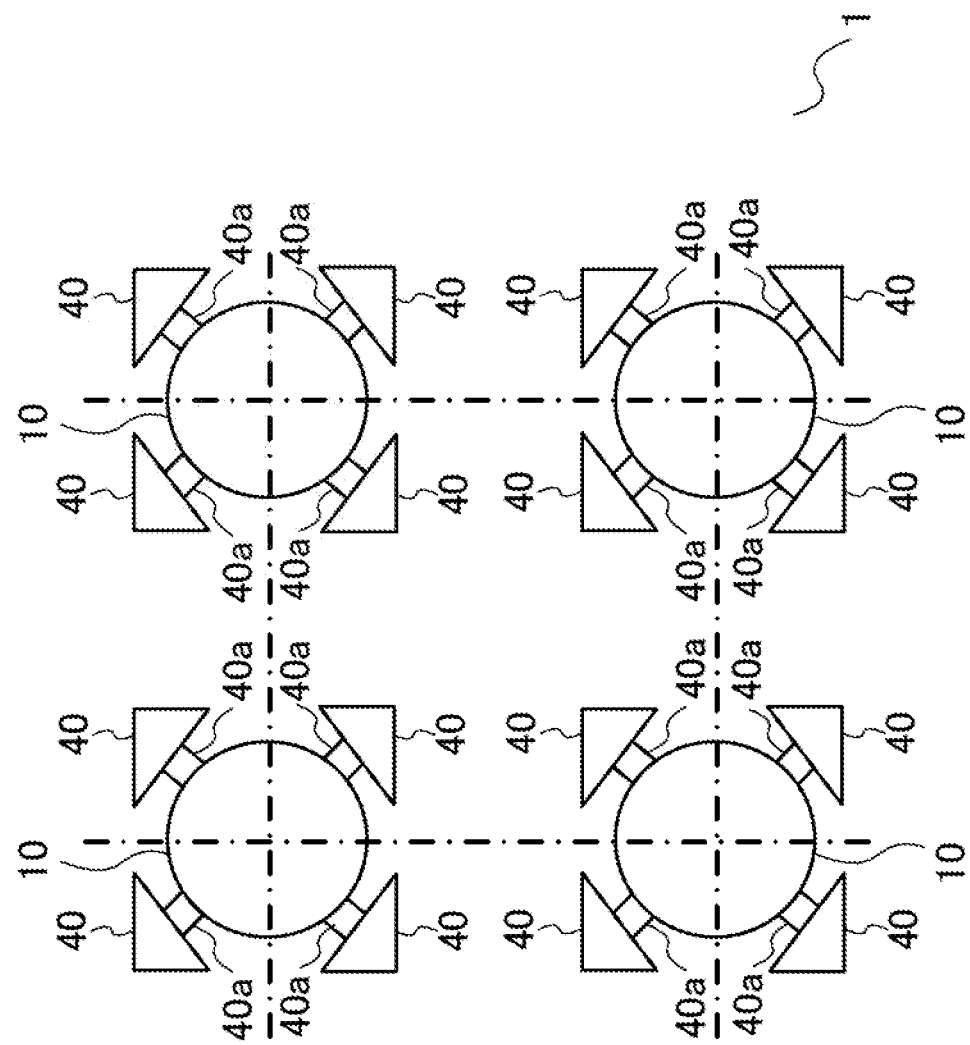

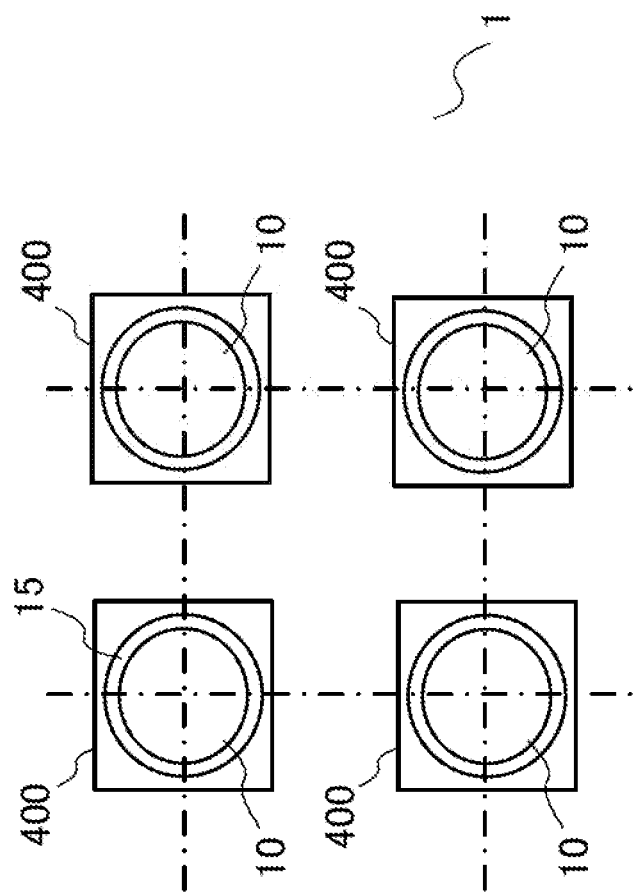

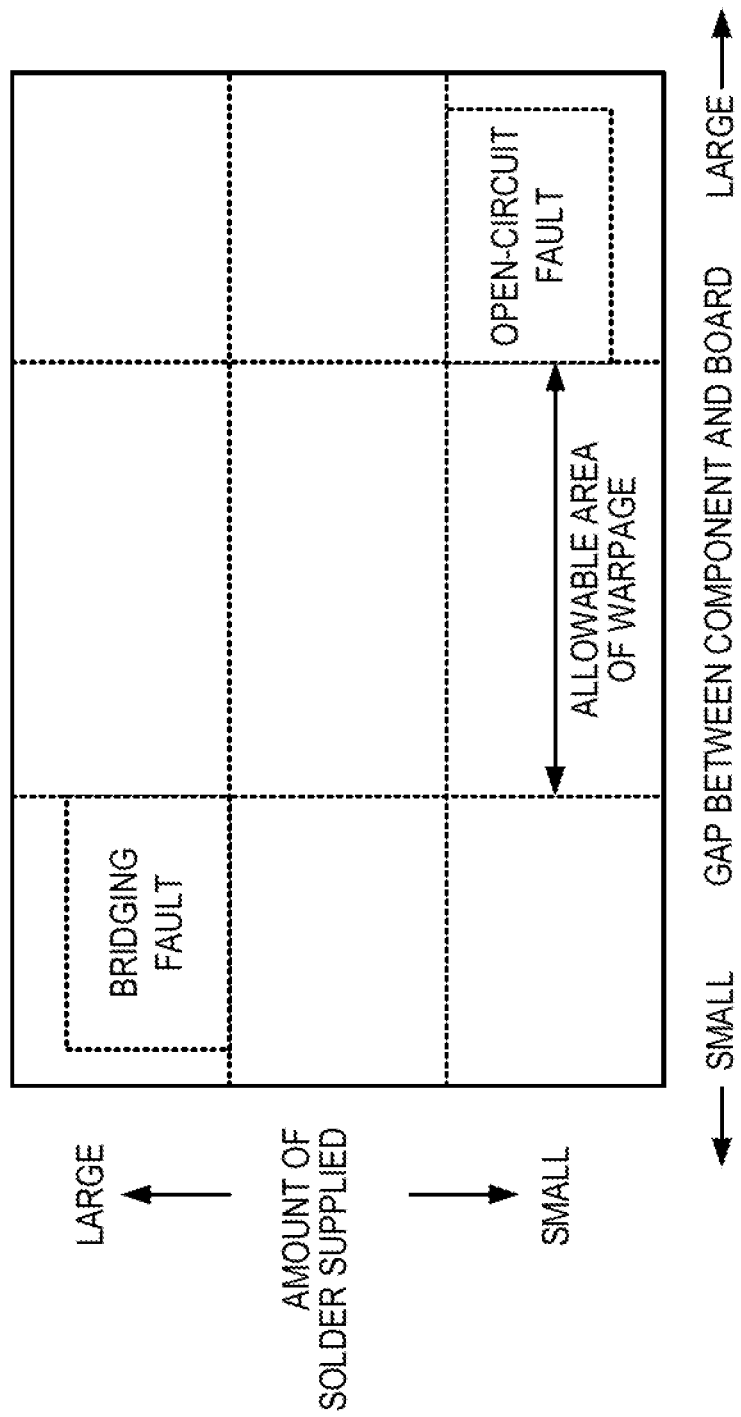

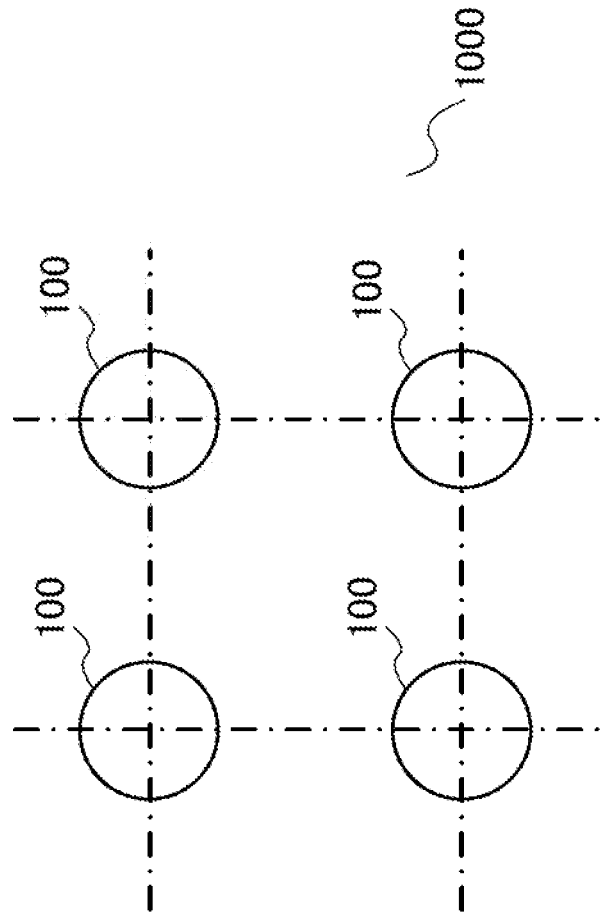

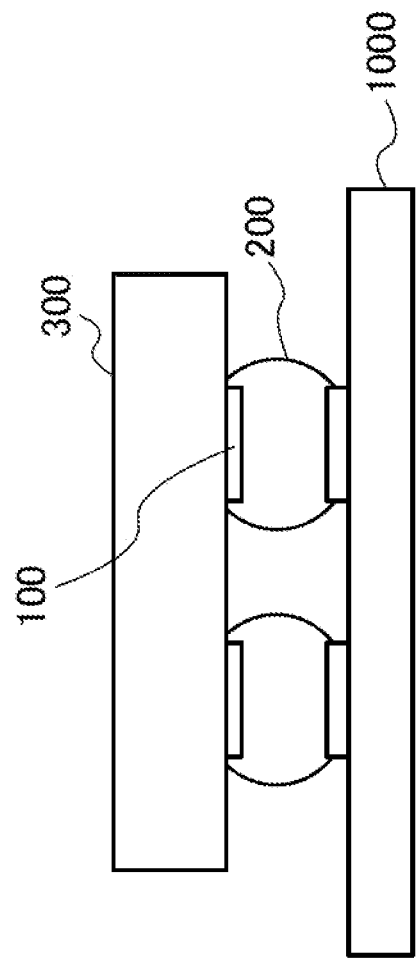

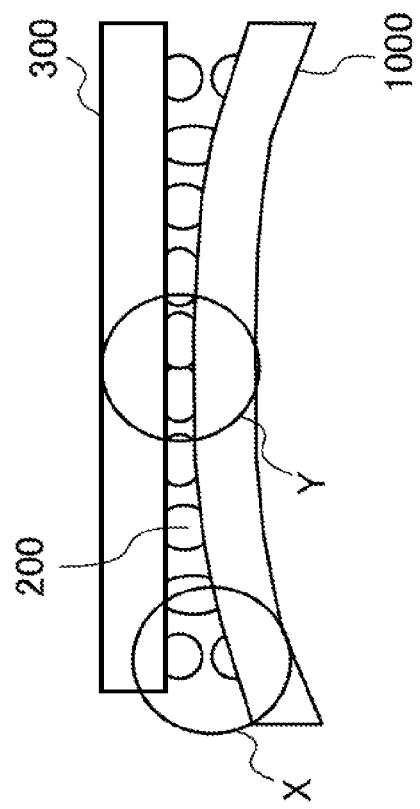
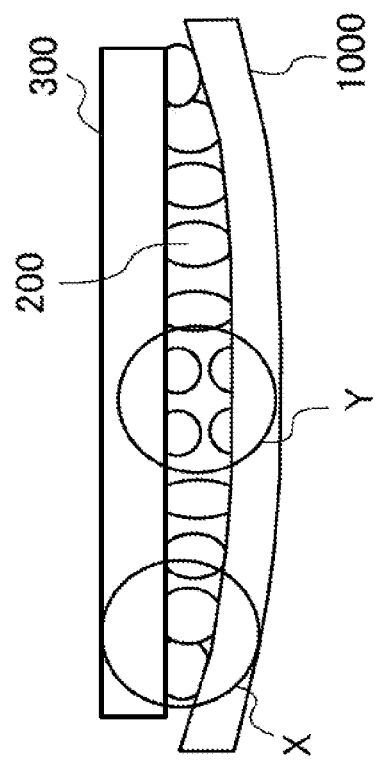

PRINTED CIRCUIT BOARD AND PRINTED CIRCUIT BOARD UNIT

CROSS-REFERENCE TO RELATED APPLICATION

This application is based upon and claims the benefit of priority of the prior Japanese Patent Application No. 2009-11233, filed on Jan. 21, 2009, the entire contents of which are incorporated herein by reference.

FIELD

Embodiments discussed herein are related to a printed circuit board on which a surface mount device is mounted, and a printed circuit board unit.

BACKGROUND

Recently, high-density packaging and downsizing in thickness is increasing in electronic device fields such as surface mount devices (SMD) having ball grid array (BGA) or land grid array (LGA). Conventionally, a plurality of lands 100 is provided on a printed circuit board 1000 as illustrated in FIGS. 10 and 11. Then, an appropriate amount of solder 200 is supplied onto each of the lands 100, and a BGA or LGA type electronic device 300 is mounted on the solder 200. Subsequently, the solder is melted by heating, and then cooled to electrically connect the lands 100 of the printed circuit board 1000 and the terminals of the mounted device.

However, in case that the 500 or greater terminals and/or 20 mm or greater length on a side of the electronic device, the amount of warpage in the printed circuit board 1 may become significant. In addition, a fine-pitch, e.g., 0.4 mm or less, between terminals of the electronic device has been increasing. Therefore, in order to maintain connectivity in an initial stage, control of the warpage amount of the printed circuit board has generally become tighter and/or stricter. FIG. 12A illustrates a printed circuit board 1000 which has warped convexly, i.e. warped upward, whereas FIG. 12B illustrates a printed circuit board 1000 which has warped concavely, i.e. warped downward. If a printed circuit board 1000 warps, a solder bump and a terminal of the device may fail to contact each other as illustrated in part X of FIG. 12A and part Y of FIG. 12B, thus causing a so-called open-circuit fault.

On the other hand, in case of increasing the supply amount of solder, open-circuit faults may be avoided. Instead, adjacent solder bumps in a molten state, however, may have contact with each other as illustrated in part Y of FIG. 12A, in part X of FIG. 12B, in FIG. 13A and FIG. 13B, thus causing a so-called bridging (short circuit) fault.

In FIG. 13, since a surface mounted device of BGA or LGA structure has fine-pitch terminals on the bottom, a bridging fault between adjacent terminals may be caused in case of over-supplied solder.

As seen in this manner, the above-mentioned faults may depend on a warpage shape of the printed circuit board. Therefore, connection reliability between the printed circuit board and the electronic device is difficult is difficult to maintain and/or increase by adjusting the supply amount of solder.

Japanese Patent Application Publication No. 10-294554, for example, discloses a printed circuit board on which at least two parallel grooves are provided between adjacent lands. The parallel grooves extend perpendicular to an array of the adjacent lands. However, according to JP-A-10-294554, an extra step of forming the parallel grooves on the printed circuit board other than conductor patterns is needed, thus incurring additional costs and time in board fabrication.

SUMMARY

According to one embodiment, a printed circuit board on which a surface mount electronic device is mounted includes a substrate and a plurality of land arrangements. Each land arrangement includes a core portion and drawing portions. The drawings portions are disposed along diagonal directions with respect to the core portions of the array of the land arrangements.

It is to be understood that both the foregoing general description and the following detailed description are exemplary, and do not restrict the invention as claimed.

BRIEF DESCRIPTION OF DRAWINGS

FIG. 1 illustrates a plan view of lands and solder-adhesion patterns provided on a printed circuit board, according to one embodiment;

FIG. 3A illustrates an arrangement in which warpage occurs;

FIG. 3B illustrates a solder-adhesion pattern arrangement adapted to a shape of the warpage of FIG. 3A, according to one embodiment;

FIG. 4A illustrates another arrangement in which warpage occurs;

FIG. 4B illustrates a solder-adhesion pattern arrangement adapted to a shape of the warpage of FIG. 4A, according to one embodiment;

FIG. 6 illustrates a plan view of lands and solder-adhesion patterns provided on a printed circuit board, according to another embodiment;

FIG. 7 illustrates a plan view of lands and solder-adhesion patterns provided on a printed circuit board, according to yet another embodiment;

FIG. 9 illustrates a supply amount of solder in accordance with a gap between an electronic device and a printed circuit board, according to one embodiment;

FIG. 10 illustrates a plan view of lands provided on a printed circuit board, according to a related art;

FIG. 11 illustrates a cross sectional view of an electronic device mounted on a printed circuit board, according to a related art;

FIG. 12A illustrates an open-circuit fault and a bridging fault due to a warpage of a printed circuit board, according to a related art;

FIG. 12B illustrates an open-circuit fault and a bridging fault due to a warpage of a printed circuit board, according to a related art;

DESCRIPTION OF EMBODIMENTS

Figure 2A:
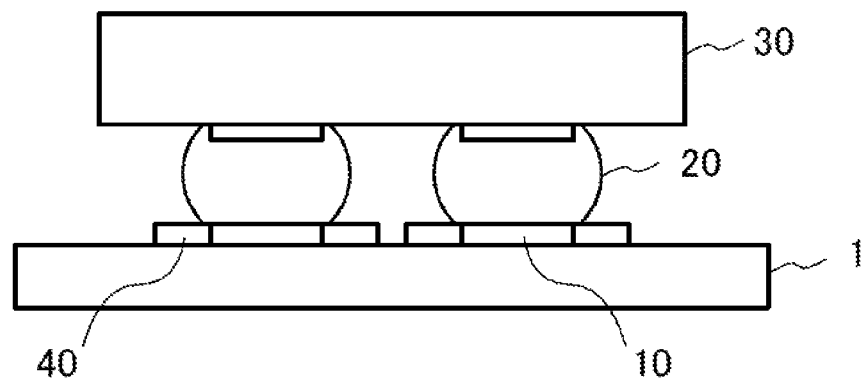
FIG. 2A illustrates a solder junction between an electronic device and a printed circuit board, according to one embodiment.

Hereinafter, embodiments of the present invention will be described with reference to the accompanying drawings.

The following embodiment will be explained based on a surface mount technology for improving initial connection reliability. The improvement of initialed connection reliability may consider warpage of a printed circuit board.

In FIG. 1, a plurality of land arrangements disposed in an array on a printed circuit board 1 are shown. Each of the land arrangements includes a core portion 10 and drawing portions 40 (e.g., solder-adhesion patterns). Referring to FIG. 1, a certain gap, e.g. approximately 0.05 to 0.2 mm, is located between the drawing portions 40 and a periphery of core portion 10 of each land arrangement on a printed circuit board 1. The drawing portions 40 draw conductive material (e.g., molten solder) placed on the core portion 10 in directions towards the drawings portions 40. The drawing portions 40 are disposed along diagonal directions with respect to the core portions 10 of the array of the land arrangements. Hereinafter, the conductive material is referred to as solder.

For example, referring to FIG. 1, assuming the solder is placed on the core portion 10 of the land arrangement in the lower right hand corner of FIG. 1, the drawing portions 40 will draw the solder towards the drawing portions arranged around the core portion 10. For example, the drawing portions 40 draw the solder in diagonal directions. As such, the flow of the molten solder in the diagonal directions is greater than the flow of the molten solder in the directions along the axes (indicated by the dotted-dashed line in FIG. 1) of the array on which the core portions 10 of the nearest neighboring land arrangements are disposed.

The drawing portions 40 may be formed on the printed circuit board 1 in accordance with the warpage shapes of the printed circuit board 1, as will be described later. In FIG. 1, in each land arrangement, four triangular patterns of the drawing portions 40 are diagonally formed around the periphery of a circular core portion 10. In addition, the four drawing portions 40 are formed such that a shape formed by virtually connecting the outermost edges of four patterns is substantially square. Furthermore, each side of the square is parallel to that of another square for an adjacent land 10.

Further, the silhouette of each land arrangement shown in FIG. 1 is considered to have an X-shape as follows: the center of the core portion 10 is the origin of the X; and the outer corners of the drawing portions are the end of the crossbars of the X. The crossbars forming the X-shaped silhouette of a land arrangement do not coincide with the axes of the array on which the core portions of the nearest neighboring land arrangements are disposed.

The drawing portions 40 may be formed by copper-foil etching or by etching using a resist. In case of the allowable degree of warpage of the printed circuit board with an appropriate supply amount of solder, molten solder is not crushed during heating, and thus the solder bump 20 adheres substantially only to a region of the core portion 10 of the land arrangement as illustrated in FIG. 2A.

Figure 2B:
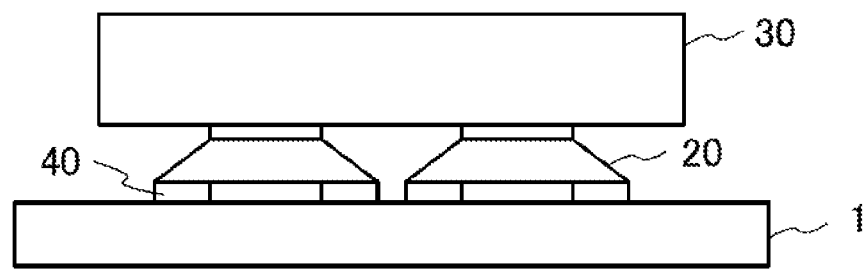
FIG. 2B illustrates a solder junction between an electronic device and a printed circuit board, according to one embodiment.
Figure 2C:
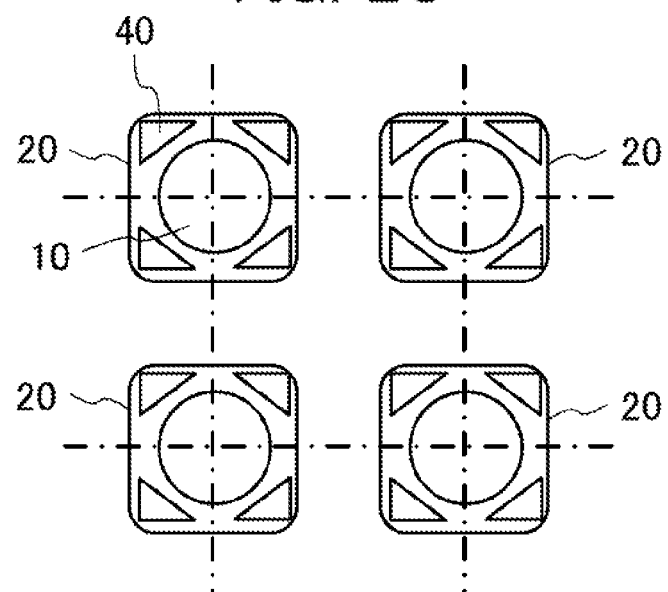
FIG. 2C illustrates a solder junction between an electronic device and a printed circuit board, according to one embodiment.

On the other hand, when the supply amount of solder is excessive, or when the warpage of the printed circuit board exceeds an allowable range, the molten solder may spread out over the diagonally-arranged drawing portions 40, and solidify along the outline of the drawing patterns, as illustrated in FIG. 2B or 2C. In this manner, depending on the degree of warpage of the printed circuit board, since the molten solder is guided to, or drawn to, flow to diagonally-arranged drawing portions 40 where a distance between adjacent land arrangement is greater, thus short circuit faults (i.e. electrical connection) between adjacent electrodes may be suppressed. The distance between diagonally adjacent land arrangements is greater than the distance between nearest neighboring land arrangements (e.g., land arrangements laterally adjacent to the land arrangement).

The diagonally-arranged drawing portions 40 are disposed in accordance with the direction of warpage of the printed circuit board according to examples. FIG. 3B is one example of arranging patterns in accordance with the warpage shape of the printed circuit board. When the printed circuit board 1 warps concavely as illustrated in FIG. 3A, that is, when the printed circuit board 1 hangs lower at the central region than at the edge regions, the drawing portions 40, as illustrated in FIG. 3B, are formed in accordance with a contour line of a concentric circle with respect to the central region of the printed circuit board 1. In FIG. 3B, two drawing portions 40 for each core portion 10 of a land arrangement on the printed circuit board 1 are diagonally arranged in accordance with the contour line. A land arrangement including two drawing portions 40 and a core portion 10 is considered to represent, in silhouette, an oval shape. The longitudinal axis of the oval-shaped silhouette does not coincide with the axes of the array on which the core portions of the nearest neighboring land arrangements are disposed.

Alternatively, additional patterns orthogonal to an outer contour line (R1), as illustrated in FIG. 4B, may be formed diagonally on the periphery of the land where the extent of crush of molten solder is greater. That is, for example, four drawing portions 40 may be included in each land arrangement located at corner portions of the electronic device 30. Land arrangements on a central contour line (R2) where the extent of crush of solder bumps is smaller and/or smallest may be provided with no solder-adhesion patterns. Land arrangements on a contour line (R3) between the outer contour line (R1) and the central contour line (R2) may be provided with two patterns for each land in accordance with the contour line (R3) as previously described with respect to FIG. 3. (FIG. 3 refers to herein as FIGS. 3A and 3B).

Since the number and/or position of patterns may be determined based on the warpage of the printed circuit board, it is possible to efficiently control the flow of molten solder.

Figure 5B:
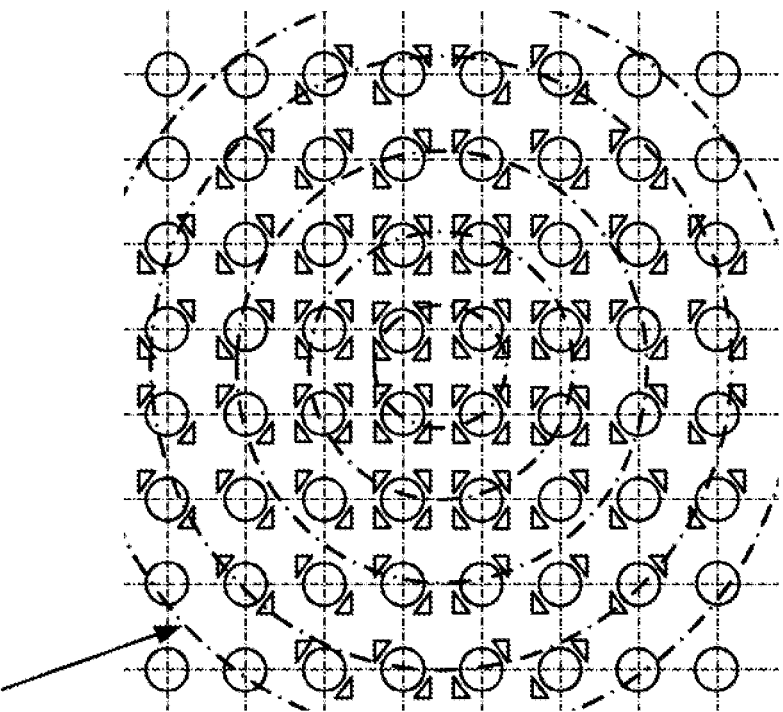
FIG. 5B illustrates a solder-adhesion pattern arrangement adapted to the shape of warpage of FIG. 5A, according to one embodiment.
Figure 5A:
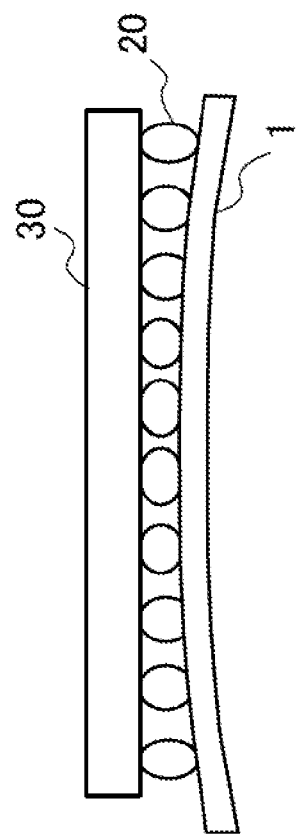
FIG. 5A illustrates an arrangement in which warpage occurs.

On the other hand, when the printed circuit board 1 warps convexly as illustrated in FIG. 5A, that is, when the edge regions of the printed circuit board 1 hang lower than the central regions of the printed circuit board 1, a gap between the printed circuit board 1 and the electronic device 30 is more narrow at the central region than at the edge regions, and thus the molten solder at the central region is more likely to overflow from the land arrangements. In such a case, the number of drawings portion 40 on the central contour lines may be increased to four drawing portions, for example. The number of patterns on outer contour lines may be decreased, for example. In this case, at least two patterns are provided diagonally in accordance with a contour line in cases where patterns are to be provided. In the central region of the printed circuit board, two patterns among four patterns for each land are formed in a direction orthogonal to the central contour lines.

As another embodiment, bridge portions 40a may be further provided between the core portion 10 and the diagonal-arranged drawing portions 40 of a land arrangement, to connect the core portion 10 and the diagonal-arranged drawing portions 40 of the land arrangement as illustrated in FIG. 6. The bridge portions 40a may respectively guide molten solder with ease to the diagonal-arranged drawing portions 40.

As yet another embodiment, a land arrangement includes a core portion 10 and a drawing portion 400 as shown in FIG. 7. An inner circumference of the drawing portion 400 may be formed into a concentric circle so as to surround the core portion 10. As shown in FIG. 7, a certain gap 15 may be maintained between the core portion 10 and the drawing portion 400. The outer periphery or the silhouette of the drawing portion 400 presents a square, for example.

According to the above-described embodiments, since a molten solder during heating may spread out over drawing portions as well as the land as illustrated in FIG. 2B, the height of solder bumps may be controlled over the electronic mount region, and thus the short circuit fault between adjacent lands and/or the open circuit fault may be suppressed and/or avoided.

Figure 8:
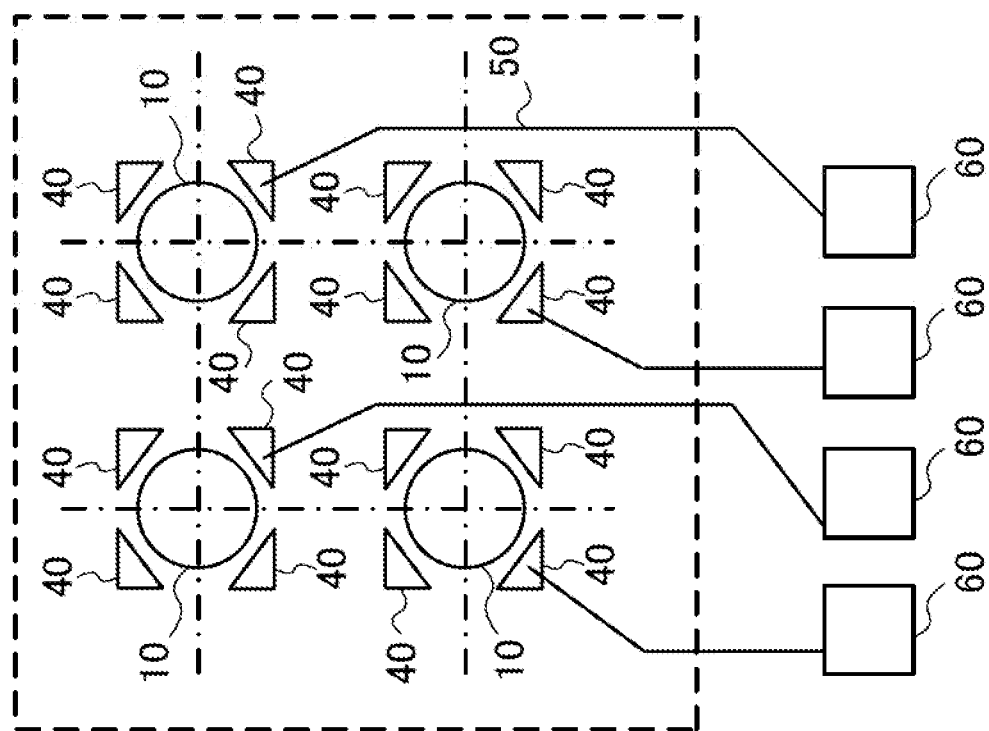
FIG. 8 illustrates a plan view of an external terminal and a lead-out pattern disposed on a printed circuit board, according to an example of one embodiment.
Figure 13A:
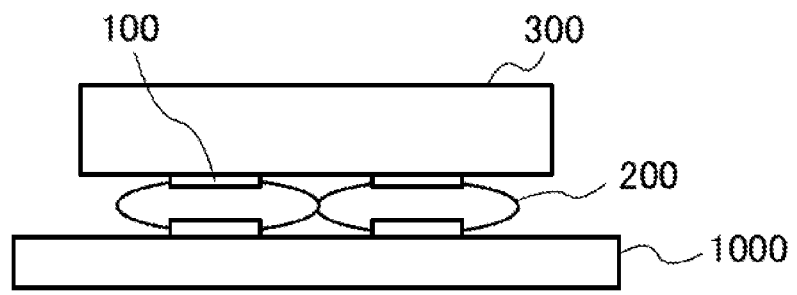
FIG. 13A illustrates a crushed solder bump due to a warpage of a printed circuit board, according to a related art.
Figure 13B:
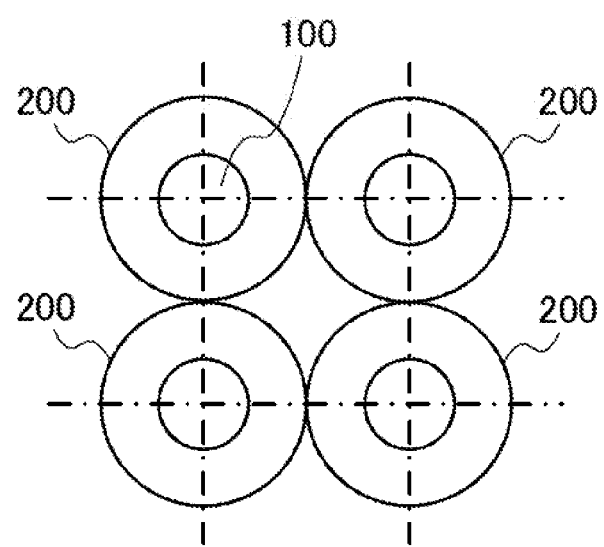
FIG. 13B illustrates a crushed solder bump due to a warpage of a printed circuit board, according to a related art.

FIG. 8 illustrates an example of one embodiment. A lead-out pattern 50 is provided on a printed circuit board as conductive patterns. The lead-out pattern 50 extends from a drawing portion 40 arranged around a periphery of a core portion 10 of a land arrangement to an external terminal 60. Therefore, a flow status of solder into the solder-adhesion pattern 40 may be detected.

FIG. 9 illustrates a supply amount of solder in accordance with a gap between an electronic device and a printed circuit board, according to one embodiment. For example, an electronic device may have a 0.5 mm pitch and 100 pins or more. The outline dimension of an electronic device may be 10 mm or above on a side. The thickness of a package substrate is approximately 1.0 mm. Accordingly, the thickness of a printed circuit board on which electronic devices is mounted may be downsized in thickness to as thin as approximately 0.5 mm. The warpage amount of the printed circuit board may be controlled to be within 100 µm by adjusting the amount of solder to be supplied to the printed circuit board, as illustrated in FIG. 9 according to one embodiment.

Examples of embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made therein without departing from the spirit and scope of the present invention as set forth in the claims.

What is claimed is:

1. A printed circuit board on which a surface mount electronic device is mounted, comprising:
    a substrate; and
    a plurality of land arrangements disposed in an array on the substrate,
    each land arrangement including a core portion and multiple, discrete drawing portions,
    the plurality of land arrangements being disposed in the array such that centers of the respective core portions form a quadrangle when virtually connected with four lines, and
    the drawing portions are disposed along diagonal lines passing through the center of the quadrangle.

2. The printed circuit board according to claim 1, wherein the drawing portions are formed of the same material as the core portion of the land arrangements.

3. The printed circuit board according to claim 1, wherein the drawing portions are disposed with a certain gap from the core portion.

4. The printed circuit board according to claim 1, further comprising:
    bridge portions that are formed narrower than a width of the core portion that connects to the drawing portions.

5. The printed circuit board according to claim 4, wherein the bridge portions, the drawing portions, and the core portion are integrally formed.

6. The printed circuit board according to claim 1, wherein the drawing portions are disposed selectively based on a warpage shape of the substrate.

7. A printed circuit board on which a surface mount electronic device is mounted, comprising:
    a substrate; and
    a plurality of land arrangements disposed in an array on the substrate, each land arrangement including a core portion and drawing portions, the drawing portions being disposed in accordance with a contour line of a concentric circle with respect to a central region of the substrate based on a warpage shape of the substrate.

8. The printed circuit board according to claim 6, wherein four drawing portions of a land arrangement are diagonally disposed with respect to said core portion of the land arrangement, the land arrangement being located at corner portion of a region where the surface mount electronic device is mounted on the substrate, the silhouette of the land arrangement being an X-shape.

9. The printed circuit board according to claim 1, further comprising:
    an external terminal disposed outside a region where the surface mount electronic device is mounted on the substrate; and
    a lead-out pattern extending from one of the land arrangements to the external terminal.

10. A printed circuit board unit comprising:
    a surface mount electronic device; and
    a printed circuit board on which the surface mount electronic device is mounted with solder,
    wherein the printed circuit board includes:
    a substrate; and
    a plurality of land arrangements disposed in an array on the substrate,
    each land arrangement including a core portion and multiple, discrete drawing portions,
    the plurality of land arrangements being disposed in the array such that centers of the respective core portions form a quadrangle when virtually connected with four lines, and
    the drawing portions are disposed along diagonal lines passing through the center of the quadrangle.

11. The printed circuit board according to claim 1, wherein the each land arrangement includes the a core portion and the plurality of drawing portions,
    the drawing portions and the core portion being disposed to represent, in silhouette, at least one of an X-shape and oval shape for each land arrangement.

12. The printed circuit board according to claim 11, wherein the drawing portions are disposed to draw molten solder placed on the core portion towards the drawing portions.

13. The printed circuit board according to claim 12, wherein the drawing portions draw the molten solder such that a flow of molten solder in a direction towards the drawing portions is greater than a flow of molten solder in a direction between the drawing portions.

14. The printed circuit board according to claim 11, wherein the drawing portions and the core portion of a land arrangement of the plurality of land arrangements represent, in silhouette, the X-shape, and
  crossbars forming the X-shape are arranged to not coincide with axes of the array on which core portions of nearest neighboring land arrangements to the land arrangement are disposed.

15. The printed circuit board according to claim 11, wherein the drawing portions and the core portion of a land arrangement of the plurality of land arrangements represent, in silhouette, the oval shape, and
  a longitudinal axis of the oval shape of the land arrangement does not coincide with axes of the array on which core portions of nearest neighboring land arrangements to the land arrangement are disposed.

\* \* \* \* \*